Aug. 15, 1950 J. MOIR 2,519,063
RADIO-PHONOGRAPH COMBINATION
Filed Oct. 25, 1947
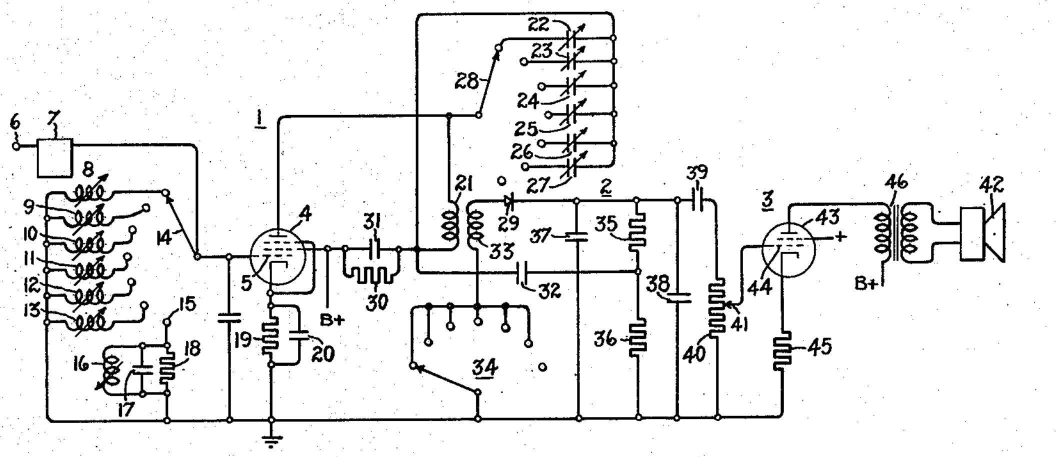
Inventor:
James Moir,
by Merton D. Morse
His Attorney.

Patented Aug. 15, 1950 2,519,063

UNITED STATES PATENT OFFICE 2,519,063

RADIO-PHONOGRAPH COMBINATION

James Moir, Rugby, England, assignor to General Electric Company, a corporation of New York Application October 25, 1947, Serial No. 782,120
In Great Britain November 1, 1946

3 Claims. (Cl. 179—100.11)

This invention relates to electronic circuits for receiving signal modulated carrier waves and it has for its primary object to provide a new and improved electronic circuit in which a stage thereof normally employed for translation of a high frequency wave may be selectively employed for amplification of audio frequency oscillations.

In most cases where it is desired to adapt a radio receiver for reproducing sound from a phonograph record or for otherwise amplifying audio frequency signals, the audio frequency signals are introduced in the input of the demodulation stage of the receiver or into the input circuit of an audio frequency amplifying tube.

In the event that the receiver is constructed only to receive signal modulated carrier waves of large amplitude, for example, in a receiver adapted for demodulating signal modulated carrier waves impressed on the input of the receiver from a wired circuit, or is provided with comparatively small gain on the audio frequency side, there may be insufficient audio frequency amplification in the receiver satisfactorily to amplify the audio frequency oscillations arising in the output of a phonograph pickup. In the receiver, however, there may be present, prior to the demodulating stage of the receiver, a high frequency amplifying stage inserted for the purpose of enabling the receiver to have a desired selectivity. In this case, the possibility arises of using the electron discharge device in the high frequency amplifying stage also to constitute the first stage of the audio frequency amplifying channel for use in the phonograph pickup.

It is desirable, however, to simplify the receiver so far as is possible by the avoidance of additional switches for the purpose of changing the internal connections of the receiver when used for audio frequency amplification alone. It is another object of the present invention to provide an arrangement which avoids the use of internal switching, other than that essential for the connection into the receiver of the source of audio frequency oscillations.

In a circuit arrangement for receiving signal modulated carrier waves and comprising at least one high frequency amplifying stage, a demodulating stage, and at least one audio frequency amplifying stage, according to the invention, the amplifying stage (or one of them) prior to the demodulating stage consists of an electron discharge device having in series in its anode circuit both a circuit resonant to the high frequency oscillations to be amplified and an anode resistor shunted by a by-pass condenser for the high frequency oscillations. The anode end of the resistor is connected to a point in the circuit arrangement subsequent to the demodulating stage through a capacitor capable of passing audio frequency oscillations, whereby the circuit arrangement is rendered capable, at will, either of receiving signal modulated carrier waves or amplifying audio frequency oscillations applied to the grid of said electron discharge device without modification.

For a better understanding of the invention, reference may be had to the following description taken in connection with the accompanying drawing, and its scope will be pointed out in the appended claims. The single figure of the drawing represents a portion of the circuit of a radio receiver embodying my invention.

The receiver illustrated in the drawing may conveniently consist of a single high frequency stage 1, a demodulating stage 2, and a single low frequency stage 3. Such an arrangement is entirely adequate when the incoming signal modulated carrier wave is conveyed by a wired circuit to the input terminal of the receiver. In such an arrangement, the carrier wave level would normally be sufficient to be demodulated directly and the demodulation products applied to the audio frequency stage 3 of the receiver. Such an arrangement, however, would be relatively unselective and the introduction of the high frequency stage 1 enables two or more frequencies to be satisfactorily selected without mutual interference.

The high frequency stage 1 comprises an electron discharge device 4 to the control electrode 5 of which are supplied either the signal modulated carrier waves to be amplified and demodulated or the audio frequency oscillations originating, for example, in a phonograph pickup. The control electrode 5 is connected to an input terminal 6 through an input circuit 7 which may include a previous high frequency stage. A plurality of inductances 8–13, illustrated as variable, may be connected in shunt with a fixed capacitance included in the apparatus 7 to form resonant circuits tuned to the frequencies of different carrier waves supplied to the terminal 6. A desired one of these carrier waves may be selected and supplied to the control electrode 5 by means of a multi-position switch 14 having a contact arm movable for connection with a desired one of the inductances 8–13. In the lowermost position of the switch 14, the contact arm thereof engages a contact button 15 to which is connected a phonograph pickup circuit comprising a phonograph pickup 16 shunted by the usual capacitance 17 and loading resistance 18.

The cathode of device 4 is connected to ground through a cathode resistance 19 shunted by a capacitor 20. The anode circuit of the device 4 contains a resonant circuit capable of being tuned to the frequency of the signal modulated carrier wave to be received and the resonant circuit is coupled in any suitable manner to the modulating stage of the receiver. Thus, the resonant circuit may comprise a fixed inductance 21 which consists of the primary winding of a high frequency transformer and a selected one of a plurality of capacitors 22–27. One terminal of the capacitors 22–27 is connected to the lower terminal of the inductance 21 and the opposite terminals of these capacitors are selectively connected through a switch arm 28 to the upper terminal of inductance 21.

The resonant circuit connected to the anode of the device 4 is coupled in any suitable manner to the demodulating stage 2 of the receiver. This stage may comprise a crystal rectifier 29 or, alternatively, a diode or a multi-electrode electron discharge device functioning as a detector. The anode circuit of the high frequency amplifier 4 also includes an anode load resistor 30 connected in series between the lower terminal of the resonant circuit and a source of anode potential designated by the legend B+. This same potential is shown as applied to the screen electrode of device 4. The anode resistor 30 is shunted in the usual manner by a capacitor 31 of a size capable of by-passing high frequency oscillations which are not intercepted by the resonant anode circuit.

To adapt the circuit arrangement described for amplifying audio frequency oscillations when the switch arm 14 is connected to the contact 15 and utilizing the high frequency electron discharge device 4 as a first stage of an audio frequency amplifier, I connect the anode end of the anode resistor 30 through a capacitor 32 directly to a point on a resistor included in the output side of the demodulating stage 2. By this means, when audio frequency oscillations are impressed on the input of the device 4, they set up potential variations at the anode which are conveyed through the capacitor 32 directly to the input side of the audio frequency amplifier 3. When the arrangement is serving as a radio receiver for signal modulated carrier waves, the path including the capacitor 32 does not affect the operation of the circuit arrangement, since it is connected on the far side of the resonant circuit connected to the anode of the high frequency amplifier 4 and tuned to the frequency of the desired carrier wave. With this connection, the path pointed out provides no loss of high frequency signal strength.

When the crystal detector 29 is used as a demodulator in demodulating stage 2 of the receiver, this detector may be connected to a secondary winding 33 of the high frequency transformer, the primary winding 21 of which constitutes the inductance of the resonant circuit in the anode circuit of the high frequency amplifier 4. The other end of the secondary winding 33 is connected through a multi-position switch 34 to ground. The switches 14, 28 and 34 preferably are ganged for unicontrol operation and the end contacts of switches 28, 34 corresponding to contact 15 of switch 14 preferably are open-circuited so that, when the switch arm 14 is connected to the pickup 16, the circuit of the demodulating stage 2 is open-circuited. Alternatively, the switch 34 may be eliminated and other methods used for completing the input circuit of the demodulating stage 2 when high frequency signals are received and for opening this circuit when audio frequency signals are received.

After passage through the detector 29, the demodulated signals are preferably smoothed by a series resistance comprising resistors 35, 36 connected in series and shunted by capacitors 37, 38. The demodulated signals are then passed through a series capacitor 39 and an additional resistor 40 which forms the main load of the detector. An adjustable tap 41 on resistor 40 applies the demodulated signal to the input of the low frequency stage 3 and serves as a volume control for adjusting the output from the loudspeaker 42 or other reproducing device used with the receiver. The low frequency stage 3 may comprise an electron discharge device 43, the tap 41 being connected to the control electrode 44 of this receiver. The cathode of this device 43 is connected to ground through a resistor 45 and the anode is connected through the primary winding of the usual output transformer 46 to a source of operating potential indicated by the legend B+. The secondary winding of transformer 46 is connected in series with the voice coil of the loudspeaker 42.

The end of the connection through the low frequency coupling capacitor 32 to the anode end of resistor 30 and the high frequency stage of the receiver is connected to the mid point of resistors 36, which, in turn, are connected in shunt with the audio frequency coupling capacitor 39 and volume control resistor 40 referred to above. The connection of this low frequency by-pass circuit on the resistors 35, 36 is preset to give the desired amplitude of audio frequency oscillations in the input circuit of the low frequency stage 3.

If two or more high frequency stages are used in a receiver either or any one of them may be arranged in the manner above described to constitute the first audio frequency amplifying device. If more than one of the high frequency stages is required to serve also as an audio frequency amplifying stage, each of such stages should be provided with an anode resistor in the resonant circuit and the audio frequency oscillations should be taken through the stages so employed in cascade by suitable audio frequency coupling capacitors.

While I have illustrated a particular embodiment of my invention, it will of course be understood that I do not wish to be limited thereto, since many modifications may be made in the circuit elements employed and in their arrangement, and I, therefore, contemplate by the appended claims to cover any such modifications as fall within the true spirit and scope of my invention.

What I claim as new and desire to secure by Letters Patent of the United States is:

1. In a radio receiver, the combination comprising a high frequency amplifier comprising an electron discharge device having an input circuit and an output circuit, switching means for selectively supplying to said input circuit signal modulated carrier waves and an audio frequency wave, a resonant circuit and a load resistance connected in series in said output circuit, said resonant circuit being tuned to the frequency of the carrier waves supplied to said input circuit, demodulating means coupled to said resonant circuit, an audio frequency amplifier having an input circuit connected to said demodulating means, and fixed coupling means for supplying said waves from the junction of said load resistance and said resonant circuit to the input circuit of said audio frequency amplifier, said coupling means comprising a series coupling capacitor capable of passing both high frequency and low frequency currents, and means for bypassing high frequency currents from the input circuit of said audio frequency amplifier.

2. In a radio receiver, the combination comprising a high frequency amplifier comprising an electron discharge device having an input circuit and an output circuit, switching means for selectively supplying to said input circuit signal modulated carrier waves and an audio frequency wave, a resonant circuit and a load resistance connected in series in said output circuit, said resonant circuit being tuned to the frequency of the carrier waves supplied to said input circuit, demodulating means coupled to said resonant circuit, an audio frequency amplifier having an input circuit connected to said demodulating means, and fixed coupling means for supplying said waves from the junction of said load resistance and said resonant circuit to the input circuit of said audio frequency amplifier, said coupling means comprising a series coupling capacitor capable of passing both high frequency and low frequency currents, means for by-passing high frequency currents from the input circuit of said audio frequency amplifier, and means for decoupling said demodulating means from said resonant circuit when said switching means is connected to supply audio frequency signals to the input circuit of said high frequency amplifier.

3. In combination, a source of signal modulated high frequency waves, a phonograph pickup, a radio receiver comprising a high frequency amplifying stage, means for selectively connecting said high frequency amplifying stage to said source or to said pickup, said high frequency stage having an output circuit comprising a resonant circuit tunable to the frequency of said high frequency wave and a load resistance connected in series, demodulating means coupled to said resonant circuit, an audio frequency amplifier having an input circuit, said demodulating means having an output circuit coupled to the input circuit of said audio frequency amplifier, a by-pass capacitance connected from the junction of said resonant circuit and said load resistance to the output circuit of said demodulating means, said by-pass capacitance having a value such that both high frequency currents and audio frequency currents are by-passed thereby, and means coupled with said selective connecting means for decoupling said demodulating means from said resonant circuit when said selecting means are adjusted to supply signals from said pickup to the input circuit of said high frequency amplifying stage.

JAMES MOIR.

REFERENCES CITED

The following references are of record in the file of this patent:

UNITED STATES PATENTS

| Number | Name | Date |
|---|---|---|
| 1,917,898 | Place | July 11, 1933 |
| 2,097,874 | Farnham | Nov. 2, 1937 |
| 2,111,711 | Van Slooten | Mar. 22, 1938 |

OTHER REFERENCES

Radio Craft, November 1940, page 268, vol. 12.